(12) United States Patent
Lee et al.

(10) Patent No.: US 7,942,716 B2
(45) Date of Patent: May 17, 2011

(54) FRIT SEALING SYSTEM AND METHOD OF MANUFACTURING ORGANIC LIGHT EMITTING DISPLAY DEVICE

(75) Inventors: Jung-Min Lee, Suwon-si (KR); Seok-Joon Yoon, Suwon-si (KR); Choong-Ho Lee, Suwon-si (KR); Hee-Seong Jeong, Suwon-si (KR); Tae-Wook Kang, Suwon-si (KR); Won-Kyu Choe, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 163 days.

(21) Appl. No.: 12/378,463

(22) Filed: Feb. 13, 2009

(65) Prior Publication Data

US 2009/0233514 A1    Sep. 17, 2009

(30) Foreign Application Priority Data

Mar. 13, 2008    (KR) .................. 10-2008-0023414

(51) Int. Cl.
*H01J 9/00*    (2006.01)
(52) U.S. Cl. ............................. 445/24; 445/2
(58) Field of Classification Search .............. 445/23–25, 445/2
See application file for complete search history.

(56) References Cited

FOREIGN PATENT DOCUMENTS

| JP | 2003-123966 | 4/2003 |
|---|---|---|
| KR | 2007-78500 | 8/2007 |

OTHER PUBLICATIONS

Office Action for corresponding Korean Application No. 2009-031291078 dated Jul. 28, 2009.

*Primary Examiner* — Joseph L Williams
(74) *Attorney, Agent, or Firm* — Knobbe Martens Olson & Bear, LLP

(57) ABSTRACT

A frit sealing system and a method of manufacturing an organic light emitting display device by using the frit sealing system, and more particularly, a frit sealing system and a method of manufacturing an organic light emitting display device by using the frit sealing system, which includes a pressure member so as to physically pressurize a first substrate and a second substrate, thereby increasing adhesion of a frit when the first substrate and the second substrate are adhered to each other by using the frit. The frit sealing system, adhering the first substrate and the second substrate by using the frit, includes: a bed member on which the first substrate is placed; a laser irradiation member irradiating a laser to the frit between the first substrate and the second substrate; and a pressure member disposed on an upper part of the first substrate and the second substrate irradiated with the laser and adhered, thereby pressurizing the first substrate and the second substrate irradiated with the laser and adhered.

16 Claims, 7 Drawing Sheets

FRIT SEALING SYSTEM AND METHOD OF MANUFACTURING ORGANIC LIGHT EMITTING DISPLAY DEVICE

CROSS-REFERENCE TO RELATED PATENT APPLICATION

This application claims the benefit of Korean Patent Application No. 10-2008-0023414, filed on Mar. 13, 2008 in the Korean Intellectual Property Office, the disclosure of which is incorporated by reference in its entirety.

BACKGROUND

1. Technical Field

The present disclosure relates to a frit sealing system and a method of manufacturing an organic light emitting display device by using the frit sealing system, and more particularly, to a frit sealing system and a method of manufacturing an organic light emitting display device by using the frit sealing system, which includes a pressure member that physically pressurizes a first substrate and a second substrate, thereby increasing adhesion of a frit disposed between a first substrate and a second substrate thereto.

2. Description of the Related Art

Recently, older style display devices have been replaced with thin flat display devices, which are portable. Of the types of flat display devices, electroluminescent display devices are active matrix-type display devices that are potential next generation display devices exhibiting wide viewing angles, high contrast, and fast response speeds. Also, compared with inorganic light emitting display devices, organic light emitting display devices having an emissive layer comprising organic materials exhibit advantageous luminance, driving voltage, and response speed, and a capability to display a wide color gamut.

An organic light emitting display device generally includes a structure comprising at least an organic layer including an emissive layer interposed between a first electrode and a second electrode. The first electrode is formed on a substrate, and serves as an anode injecting holes, and the organic layer is formed on a top surface of the first electrode. On the organic layer, the second electrode, serving as a cathode injecting electrons, is formed so as to face the first electrode.

If moisture or oxygen enters the organic light emitting device, the service life the organic light emitting display can be reduced due to oxidation and/or detachment of electrode materials, luminescent efficiency can be lowered, and/or the color can be changed.

Thus, the manufacture of an organic light emitting display device typically comprises a sealing process to isolate the organic light emitting display device from the environment and to prevent the moisture from entering into the organic light emitting display device. Examples of such sealing processes include lamination methods and encapsulation methods. A lamination method laminates an organic polymer, such as a polyester (PET), on a top surface of the second electrode of the organic light emitting display device. An encapsulation method forms a cover or a cap comprising a metal or a glass including a desiccant, fills the organic light emitting display device under the cap or the cover with nitrogen gas, and then encapsulates an edge of the cap or the cover by using a sealant such as an epoxy resin.

However, these methods often do not completely block the damaging compounds, such as the externally originating moisture or oxygen, which can ruin the device, and thus these methods are often not applicable to active-matrix organic light emitting devices (AMOLED), which are particularly vulnerable to moisture. Moreover, manufacturing processes for performing these methods are typically complicated. In order to solve the aforementioned problems, a frit encapsulation method that increases adhesion between a device substrate and the cap by using a frit as the sealant, has been developed.

The frit encapsulation method coats the frit on a glass substrate and seals an organic light emitting display device, thereby more efficiently protecting the organic light emitting display device since a gap between the device substrate and the cap is completely sealed.

The frit encapsulation method coats the frit on each sealing unit of an organic light emitting display device, and irradiates and seals the frit of each sealing unit with a moving laser irradiation device.

However, where the sealing operation involves only irradiating with a laser to harden the frit, a short-term detachment problem and a long-term reliability problem occur. To be more specific, in order to melt the frit without affecting a circumference, the sealing operation irradiates with a laser, thereby locally applying heat. The temperature of the heated area drops sharply, such that micro-cracks may be formed on the brittle frit. The micro-cracks cause a detachment problem. Also, the micro-cracks are likely to cause such detachment since the micro-cracks coalesce, as observed in a long-term reliability testing after sealing by the frit encapsulation method.

SUMMARY OF THE INVENTION

Some embodiments provide a frit sealing system including improved frit adhesion, and a method of manufacturing an organic light emitting display device by using the frit sealing system.

Some embodiments provide a system for sealing a display device using a frit, a method for using the system to manufacture a display device, and a display device made using the system and method. Embodiments of the system comprise a bed member, a laser irradiation member, and a pressure member disposed between the bed member and the laser irradiation member. The bed member is configured to support a display device comprising a first substrate, a second substrate, and a frit disposed therebetween. The bed member and laser irradiation member are relatively movable, with the laser irradiation member configured to irradiate the display device, thereby melting the frit and sealing the first substrate and the second substrate. The pressure member is configured to compress the display device between itself and the bed member, thereby compressing the frit between the first substrate and second substrate during irradiation, thereby improving adhesion between the frit and the first substrate and second substrate, as well as improving resistance to moisture and/or air infiltration into the display device. In some embodiments, the first substrate and second substrate are elements of a first mother substrate and a second mother substrate on which a plurality of display devices are manufactured. In some embodiments, the plurality of display devices are arranged in rows and columns on the mother substrates, and the system is configured to sequentially seal the display devices in a row or column. Some embodiments further comprise a partial pressure member that concentrates the compressive force on the display device being sealed.

An aspect provides a frit sealing system configured for adhering a first substrate and a second substrate by using a frit, wherein the first substrate is divided into a plurality of first substrates and the second substrate is divided into a plurality of second substrates, the frit sealing system including: a bed member on which the first substrate is placed; a laser irradiation member irradiating a laser to the frit between the first substrate and the second substrate; and a pressure member disposed on an upper part of the first substrate and the second substrate irradiated with the laser and adhered, thereby pressurizing the first substrate and the second substrate irradiated with the laser and adhered.

The frit sealing system may simultaneously and/or sequentially adhere the first substrates and the second substrates arranged in one or more rows and columns.

The pressure member may be formed to have a latticed structure, thereby pressurizing the first and second substrates, from among the first substrates and the second substrates arranged in the one or more rows and columns, surrounding the first and second substrates irradiated with a laser of the laser irradiation member.

A lattice of the latticed structure may be formed to be larger than one of the first and second substrates and to pressurize the first and second substrates surrounding the first and second substrates irradiated with the laser.

The laser irradiation member may move in one direction and sequentially adhere the first substrates and the second substrates arranged in the one direction, and the pressure member may move together with the laser irradiation member and sequentially pressurize the first and second substrates surrounding the first and second substrates irradiated with the laser.

A mask may be placed on a top side of the second substrate and the pressure member may be placed on a top side of the mask whereby the pressure member pressurizes the mask so as to adhere the first substrate and the second substrate.

The first substrate may include a pixel region in which at least an organic light emitting device (OLED) having a first electrode, an organic layer, and a second electrode is formed, and a non-pixel region formed in an outer region of the pixel region, the second substrate may be coalesced to one region comprising the pixel region of the first substrate, and the frit may be coated in one region which is between the first substrate and the second substrate and which is of the non-pixel region.

At least a part of the pressure member contacting the second substrate may be formed of an elastic material.

The frit sealing system may further include a partial pressure member interposed between the bed member and the first substrate whereby a force, by which the partial pressure member pressurizes the first and second substrates, is concentrated on an area where the partial pressure member is interposed.

Another aspect provides a frit sealing system configured for adhering a first substrate and a second substrate by using a frit, wherein the first substrate is divided into a plurality of first substrates and the second substrate is divided into a plurality of second substrates, the frit sealing system including: a bed member on which the first substrate is placed; a laser irradiation member irradiating a laser to the frit between the first substrate and the second substrate; a pressure member pressurizing the first substrate and the second substrate irradiated with the laser and adhered; and a partial pressure member interposed between the bed member and the first substrate.

The laser irradiation member may move in one direction and sequentially adhere the plurality of first and second substrates which are disposed in the one direction, and the partial pressure member, between the first substrates disposed in the one direction and the bed member, may be disposed to be parallel to the one direction.

A width of a part of the partial pressure member may be formed to be wider than a width of another part of the partial pressure member.

A width of the partial pressure member in an area, corresponding to the first and second substrates irradiated with the laser, may be formed to be wider than a width of the partial pressure member in an area corresponding to both side areas of the first and second substrates irradiated with the laser.

A thickness of a part of the partial pressure member may be formed to be thicker than a thickness of another part of the partial pressure member.

A thickness of the partial pressure member in an area, corresponding to the first and second substrates irradiated with the laser, may be formed to be thicker than a thickness of the partial pressure member in an area corresponding to both side areas of the first and second substrates irradiated with the laser.

The laser irradiation member may move in one direction, and the partial pressure member may move together with the laser irradiation member.

Another aspect provides a method of manufacturing an organic light emitting display device using a frit sealing system adhering a first substrate and a second substrate by using a frit, wherein the first substrate is divided into a plurality of first substrates and the second substrate is divided into a plurality of second substrates, the method comprising: coating the frit on the second substrate and baking the frit; coalescing the first substrate and the second substrate; hardening the frit by irradiating with a laser, thereby adhering the frit to the first substrate and the second substrate; and simultaneously pressurizing the first substrate and the second substrate while irradiating with the laser.

The operation of hardening the frit and pressurizing the first substrate and the second substrate may include the operation of irradiating with the laser one or more first and second substrates and simultaneously pressurizing substrates surrounding the one or more first and second substrates irradiated with the laser.

The operation of hardening the frit and pressurizing the first substrate and the second substrate may include the operations of sequentially irradiating with the laser the plurality of first and second substrates arranged in one direction, by a laser irradiation member moving in the one direction; and pressurizing substrates surrounding the first and second substrates, which are from among the plurality of first and second substrates and which are irradiated with the laser, by a pressure member moving together with the laser irradiation member.

In the operation of hardening the frit and pressurizing the first substrate and the second substrate, a partial pressure member may be disposed on one side of the first and second substrates irradiated with the laser, whereby a force pressurizing an outer side of the first and second substrates is concentrated on an area where the partial pressure member is disposed.

The operation of hardening the frit and pressurizing the first substrate and the second substrate may include the operations of: sequentially irradiating with the laser the plurality of first and second substrates arranged in one direction, by a laser irradiation member moving in the one direction; and moving the partial pressure member together with the laser irradiation member, wherein a width of a part of the partial pressure member is formed to be wider than a width of the another part of the partial pressure member.

The partial pressure member may move together with the laser irradiation member whereby the wider part of the partial pressure member is disposed on the one side of the first and second substrates irradiated with the laser.

The operation of hardening the frit and pressurizing the first substrates and the second substrates may include the operations of: sequentially irradiating with the laser the plurality of first and second substrates arranged in one direction, by a laser irradiation member moving in the one direction; and moving the partial pressure member together with the laser irradiation member, wherein a thickness of a part of the partial pressure member is formed to be thicker than a thickness of another part of the partial pressure member.

The partial pressure member may move together with the laser irradiation member whereby the thicker part of the partial pressure member is disposed in the one side of the first and second substrates irradiated with the laser.

Some embodiments provide a frit sealing system configured for adhering a first mother substrate to a second mother substrate with a frit, wherein the first mother substrate comprises a plurality of first substrates and the second mother substrate comprises a plurality of second substrates. The frit sealing system comprises: a bed member configured to support a first mother substrate and a second mother substrate disposed thereon; a laser irradiation member configured for irradiating a frit disposed between the first mother substrate and the second mother substrate with a laser beam; and a pressure member configured to be disposed on an upper surface of the second mother substrate, and configured for compressing the frit between the first mother substrate and the second mother substrate, thereby improving adhesion therebetween.

In some embodiments, the frit sealing system is configured to simultaneously and/or sequentially adhere the first substrates and the second substrates arranged in one or more rows and columns.

In some embodiments, the pressure member comprises a lattice structure, configured for compressing the first substrates and second substrates surrounding the first substrate and second substrate irradiated by the laser irradiation member. In some embodiments, a lattice opening of the lattice structure is larger than one of the first and second substrates, and configured to pressurize the first substrates and second substrates surrounding the first and second substrates irradiated by the laser irradiation member.

In some embodiments, the laser irradiation member is configured to sequentially adhere the first substrates and the second substrates arranged in a first direction, and the pressure member is configured to move in concert with the laser irradiation member and is configured to sequentially pressurize the first substrates and second substrates surrounding the first substrate and second substrate irradiated by the laser irradiation member.

Some embodiments further comprise a mask configured to be disposed between the top surface of the second substrate and the pressure member, thereby transmitting pressure from the pressure member to the second substrate.

In some embodiments, the first substrate comprises a pixel region comprising at least one OLED (organic light emitting device) having a first electrode, an organic layer, and a second electrode, and a non-pixel region disposed outside the pixel region, the second substrate is disposed over the pixel region of the first substrate, and the frit is disposed between the first substrate and the second substrate in the non-pixel region.

In some embodiments, at least a portion of the pressure member configured for contacting the second substrate comprises an elastic material.

Some embodiments further comprise a partial pressure member configured to be interposed between the bed member and the first substrate, and configured to concentrate a compressive force on the first substrates and the second substrates adjacent to the first substrate and the second substrate irradiated by the laser irradiation member.

Some embodiments provide a frit sealing system configured for adhering a first mother substrate and a second mother substrate with a frit, wherein the first mother substrate comprises a plurality of first substrates and the second mother substrate comprises a plurality of second substrates. The frit sealing system comprises: a bed member configured to support a first mother substrate and a second mother substrate disposed thereover; a laser irradiation member configured for irradiating with a laser beam a frit disposed between the first mother substrate and the second mother substrate; a pressure member configured for compressing the frit between the first mother substrate and the second mother substrate; and a partial pressure member disposed on the bed member, configured to be interposed between the bed member and the first substrate.

In some embodiments, the laser irradiation member is configured to sequentially adhere a plurality of first substrates and second substrates disposed in a first direction, and the partial pressure member is parallel to the first direction.

In some embodiments, the partial pressure member comprises a wider portion and a narrower portion. In some embodiments, the narrower portion of the partial pressure member corresponds to the first substrate and second substrate irradiated with the laser, and the wider portion of the partial pressure member is adjacent to thereto in the first direction.

In some embodiments, the partial pressure member comprises thicker portion and a thinner portion. In some embodiments, the thicker portion of the partial pressure member, corresponds to the first substrate and second substrates irradiated with the laser, and the thinner portion is adjacent thereto in the first direction.

In some embodiments, the partial pressure member is configured to move sequentially under each first substrate and second substrate irradiated by the laser irradiation member.

Some embodiments provide a method of manufacturing an organic light emitting display device using a frit sealing system configured for adhering a first mother substrate and a second mother substrate with a frit, wherein the first substrate comprises a plurality of first substrates and the second substrate comprises a plurality of second substrates. The method comprises: coating a frit on a second mother substrate and baking the frit; assembling the first mother substrate and the second mother substrate with the frit therebetween; and irradiating with a laser the first mother substrate and the second mother substrate and simultaneously compressing the frit therebetween, thereby hardening the frit therebetween and adhering the first mother substrate and the second mother substrate.

In some embodiments, irradiating and compressing comprises irradiating with the laser one or more first substrates and second substrates and simultaneously compressing substrates surrounding the one or more irradiated first substrates and second substrates.

In some embodiments, irradiating and compressing comprises: sequentially irradiating a plurality of first substrates and second substrates arranged in a first direction, using a laser irradiation member sequentially moving in a first direction; and compressing first substrates and second substrates surrounding the first substrates and second substrates irradiated with the laser, using a pressure member sequentially moving in concert with the laser irradiation member.

In some embodiments, irradiating and compressing comprises disposing a partial pressure member under each irradiated first substrate, thereby concentrating a compressive force adjacent to each irradiated first substrate.

In some embodiments, irradiating and compressing comprises: sequentially irradiating the plurality of first substrates and second substrates arranged in the first direction, using a laser irradiation member sequentially moving in the first direction; and sequentially moving the partial pressure member in concert with the laser irradiation member, wherein the partial pressure member comprises a wider portion and a narrower portion. In some embodiments, the wider portion of the partial pressure member is disposed to one side of each irradiated first substrate and second substrate.

In some embodiments, irradiating and compressing comprises: sequentially irradiating the plurality of first substrates and second substrates arranged in the first direction, using a laser irradiation member sequentially moving in the first direction; and sequentially moving the partial pressure member in concert with the laser irradiation member, wherein the partial pressure member comprises a thicker portion and a thinner portion. In some embodiments, the thicker portion of the partial pressure member is disposed to one side of each irradiated first substrate and second substrate.

BRIEF DESCRIPTION OF THE DRAWINGS

The above and other features and advantages will become more apparent by describing in detail exemplary embodiments thereof with reference to the attached drawings in which.

DETAILED DESCRIPTION OF CERTAIN EMBODIMENTS

Certain embodiments will now be described more fully with reference to the accompanying drawings, in which exemplary embodiments are shown.

First Embodiment

Figure 1:
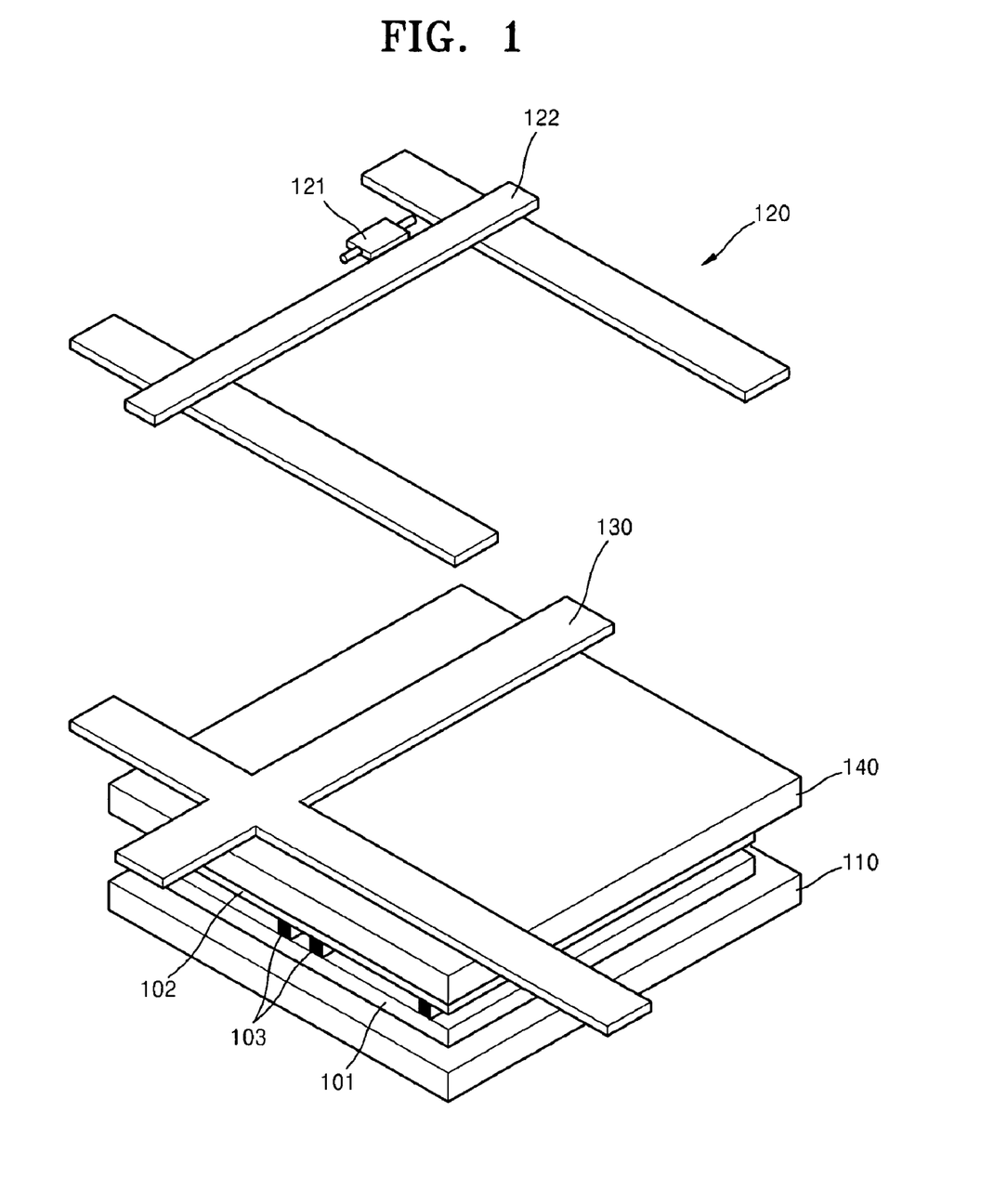
FIG. 1 is a perspective view of a frit sealing system according to a first embodiment.
Figure 2:
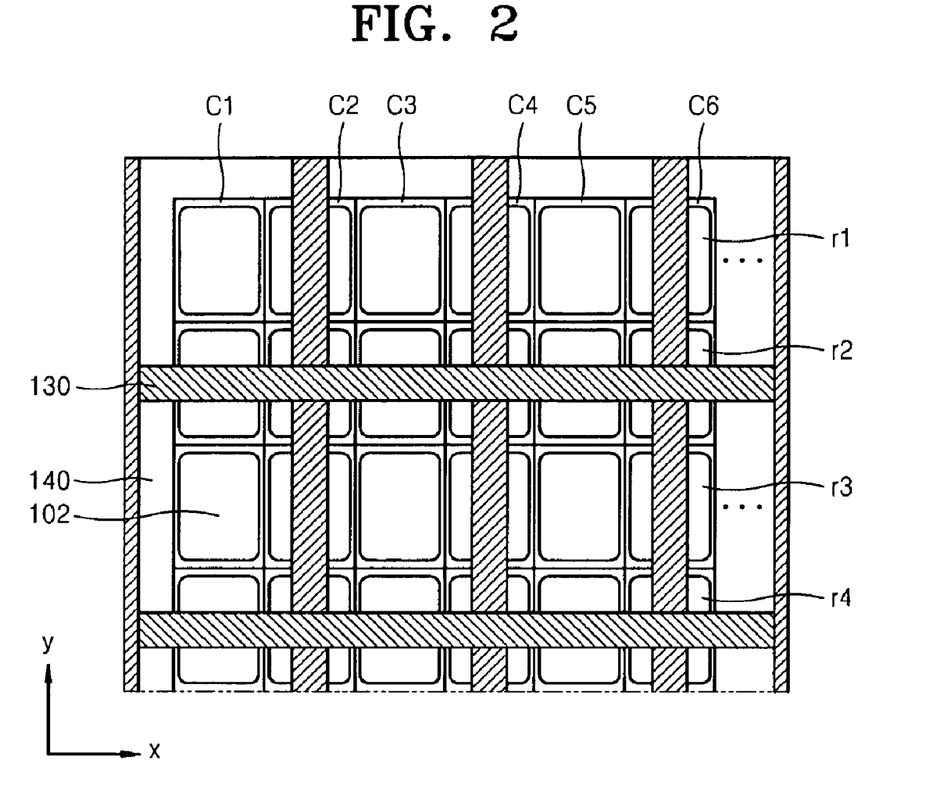
FIG. 2 is a plan view of the frit sealing system of FIG. 1.
Figure 3:
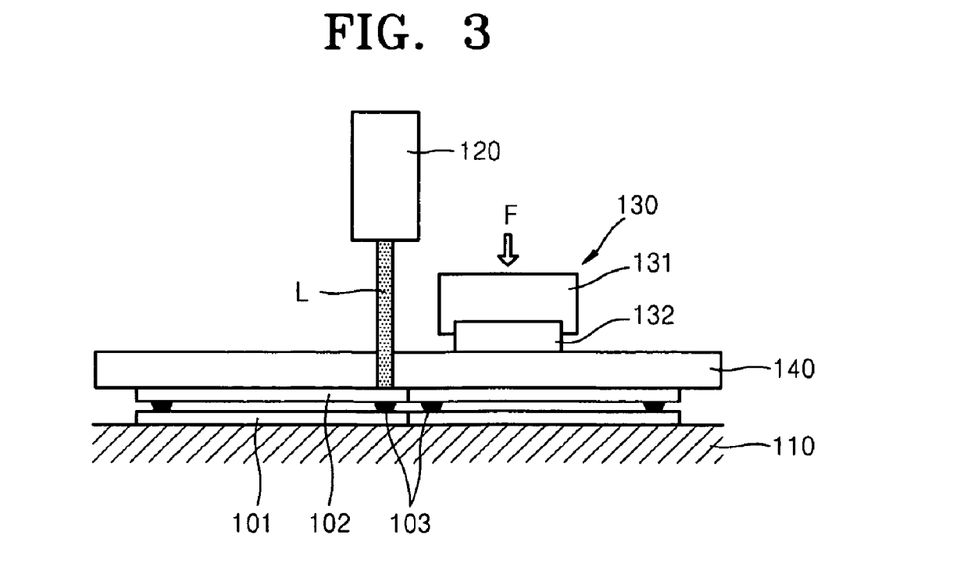
FIG. 3 is a cross-sectional side view of the frit sealing system of FIG. 1.

FIG. 1 is a perspective view of a part of a frit sealing system according to a first embodiment. FIG. 2 is a plan view of the frit sealing system of FIG. 1. FIG. 3 is a cross-sectional side view of the part of the frit sealing system of FIG. 1.

In general, the term frit refers to a glass in a powdered state. As used herein, the term frit collectively also refers to glass in a gel state obtained by adding an organic material to glass in a powdered state, and a hardened glass in a solid state obtained by irradiating a frit comprising powdered glass with a laser.

Referring to FIG. 1, the frit sealing system according to the first embodiment includes a bed member 110, a laser irradiation member 120, a pressure member 130, and a mask 140.

A first substrate 101 and a second substrate 102 are placed on the bed member 110. A frit 103 is coated or disposed between the first substrate 101 and the second substrate 102.

The laser irradiation member 120 irradiates the frit 103 disposed between the first substrate 101 and the second substrate 102 with a laser beam, thereby melting-adhering the frit 103 to the first and second substrates 101 and 102.

In the present embodiment, a laser head 121 is supported by a laser head guide 122, and is arranged so as to move the laser head above the first and second substrates 101 and 102.

The pressure member 130 is disposed on the upper part of the first and second substrates 101 and 102, thereby pressurizing an outer side of the first and second substrates 101 and 102, which are irradiated with the laser to adhere to each other by the frit.

The mask 140 is placed on a top side of the second substrate 102, and prevents the pressure member 130 from directly contacting the second substrate 102, thereby protecting the second substrate 102 against breakage and damage.

To be more specific, a structure in which an organic light emitting display device is sealed by a frit coated or disposed on a glass substrate may more efficiently protect the organic light emitting display device when a gap between the glass substrate and a cap is completely sealed. In this manner, such a frit encapsulation method coats the frit on each sealing unit of a organic light emitting display device, and controls a laser irradiation device to move over and to irradiate to the frit of each sealing unit of the organic light emitting display device, thereby hardening the frit and sealing the device. However, in the case where only the sealing operation of irradiating with the laser and hardening the frit is performed, a short-term detachment problem and a long-term reliability problem can occur.

In order to solve the aforementioned problems, the frit sealing system according to the first embodiment includes the pressure member 130 for pressurizing the first and second substrates 101 and 102, which are irradiated with the laser and adhered together by the frit, and directly pressurizes together the first and second substrates 101 and 102, so that the frit sealing system improves adhesion of the frit 103 and increases a long-term reliability of a cell or sealing unit.

Referring to FIGS. 2 and 3, the frit sealing system simultaneously and/or sequentially adheres together a plurality of first substrates 101 and a plurality of second substrates 102 arranged in one or more rows and/or columns. In other words, large mother boards or glasses are adhered to each other at one time, and then are divided or diced into a plurality of organic light emitting display devices.

FIGS. 2 and 3 illustrate an embodiment in which the first and second substrates 101 and 102 are arranged in four rows, r1 through r4, and six columns, c1 through c6, of display units, and are adhered to each other by the frit sealing system according to the first embodiment. At this time, in general, the laser irradiation member 120 moves in a first direction (for example, the X-axis direction of FIG. 2), and sequentially adheres the first and second substrates 101 and 102 arranged in the first direction (the X-axis direction). That is, the laser irradiation member 120 circles at or near the edges of the first and second substrates 101 and 102 in the r1 and c1 position, and adheres the first and second substrates 101 and 102 in the r1 and c1 position. After that, the laser irradiation member 120 sequentially adheres the first and second substrates 101 and 102 in r1 and c2, r1 and c3, r1 and c4, r1 and c5, and r1 and c6 positions, while moving in the X-axis direction, and then moves to the r2 row so as to sequentially adhere the first and second substrates 101 and 102 arranged in the r2 row.

Otherwise, in the case where there is a plurality of the laser heads 121, every other substrate arranged in the first direction (for example, the X-axis direction) may be simultaneously adhered. For example, in an embodiment comprising three laser heads 121, the laser irradiation member 120 may simultaneously adhere the first and second substrates 101 and 102 arranged in the r1 and c1, r1 and c3, and r1 and c5 positions, move in the first direction (the X-axis direction of FIG. 2) by as much as one cell, and then simultaneously adhere the first and second substrates 101 and 102 arranged in the r1 and c2, r1 and c4, and r1 and c6 positions.

At this time, the pressure member 130 may comprise a latticed structure so as to pressurize substrates surrounding a substrate irradiated with the laser beam L. Here, each size of the openings in the lattice structure is larger than each substrate so that the pressure member 130 pressurizes the substrates surrounding the substrate irradiated with the laser L. In other words, while the first and second substrates 101 and 102 in the r1 and c1 position are adhered, the first and second substrates 101 and 102, in r1 and c2, r2 and c1, and r2 and c2 positions, which surround the first and second substrates 101 and 102 in the r1 and c1 position, are compressed by the pressure member 130 with a force F. At the same time, while the first and second substrates 101 and 102 in the r1 and c3 position are adhered, the first and second substrates 101 and 102, in r1 and c2, r1 and c4, r2 and c2, r2 and c3, and r2 and c4 positions and surrounding the first and second substrates 101 and 102 in the r1 and c3 position, are compressed or pressurized by the pressure member 130.

Referring to FIG. 3, the pressure member 130 may include a base 131 and a contact unit 132. The base 131 may form a base of the pressure member 130, and comprise a material, such as a stainless steel (SUS), with at least a predetermined weight, thereby compressing a substrate with a considerable pressure. In order to compensate for non-uniformity of an upper part of a mask 140 contacting a contact unit 132, and to prevent damage and breakage of the mask 140, the contact unit 132 may comprise a material having a predetermined elasticity, such as a rubber or an acrylic.

The pressure member 130 moves together with the laser irradiation member 120, and sequentially compresses substrates adjacent to or surrounding a substrate irradiated by the laser. As described above, the laser irradiation member 120 adheres the first and second substrates 101 and 102 in the r1 and c1 position, and sequentially adheres the first and second substrates 101 and 102 in the r1 and c2, r1 and c3, r1 and c4, r1 and c5, and r1 and c6 positions, while moving in the X-axis direction. At this time, the pressure member 130 also moves together with the laser irradiation member 120, and pressurizes the substrates surrounding the substrate irradiated by the laser. In other words, the pressure member 130 pressurizes the substrates which are not irradiated with the laser.

The frit sealing system according to the first embodiment compresses or pressurizes a substrate by including the pressure member 130 capable of physically pressurizing the substrate, thereby improving adhesion of the frit and increasing the long-term reliability of a cell.

Figure 4A:
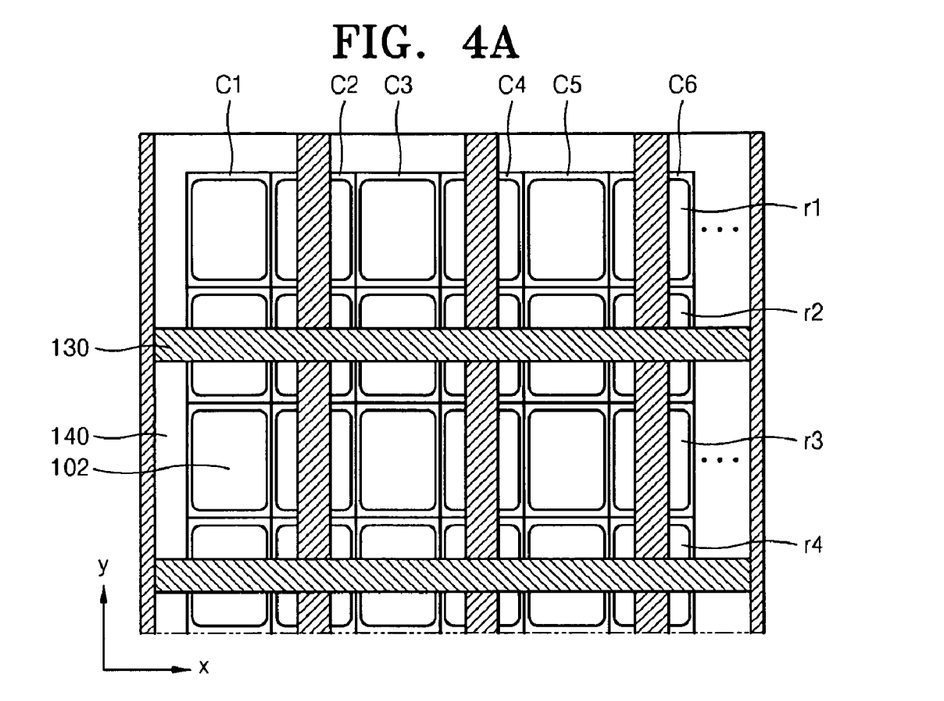
FIGS. 4A and 4B are diagrams for illustrating an embodiment of a method of manufacturing an organic light emitting display device.
Figure 4B:
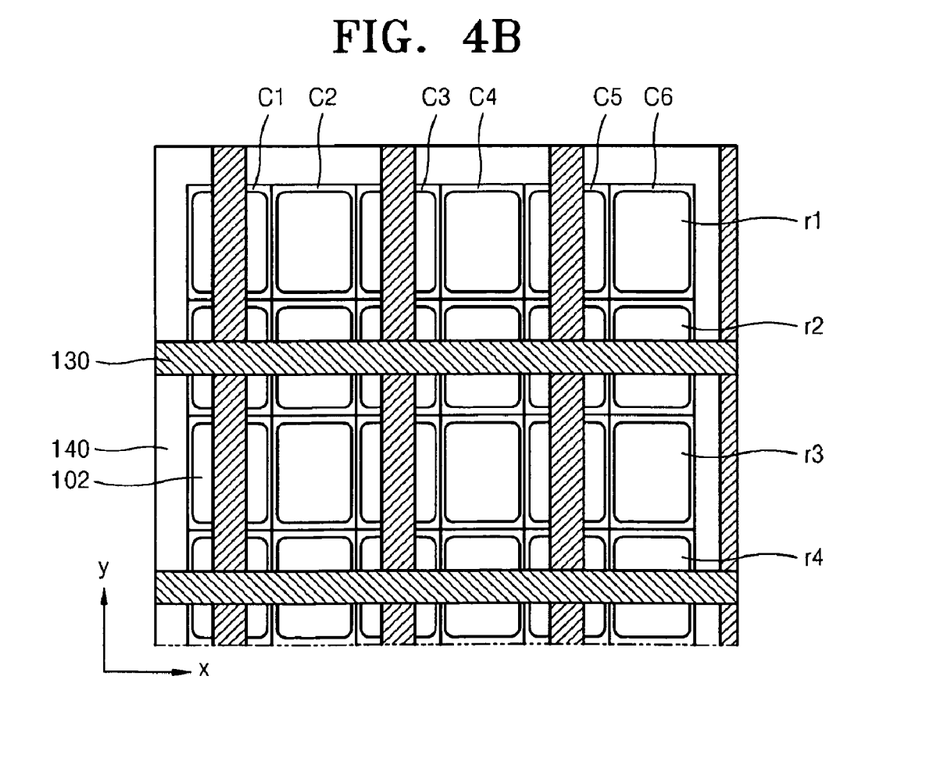

FIGS. 4A and 4B are diagrams illustrating an embodiment of a method of manufacturing an organic light emitting display device.

Referring to FIG. 4A, the first embodiment of the method of manufacturing the organic light emitting display device by using the frit sealing system is as follows.

First, the second substrate 102, coated with the frit 103 and baked, is assembled with the first substrate 101 (see FIG. 3). After that, the second substrate 102 is irradiated with a laser, thereby hardening the frit 103, and at the same time, a portion of the second substrate 102 peripheral to the laser irradiation is pressurized or compressed.

As described above, in general, the laser irradiation member 120 moves in a first direction (for example, the X-axis direction of FIGS. 4A and 4B), and sequentially adheres substrates arranged in the first direction (the X-axis direction).

At this time, as illustrated in FIG. 4A, the laser irradiation member 120 first and simultaneously adheres the first and second substrates 101 and 102 in r1 and c1, r1 and c3, and r1 and c5 positions. That is, each of the plurality of the laser heads 121 circles at or near the edges of the first and second substrates 101 and 102 in the r1 and c1, r1 and c3, and r1 and c5 positions, and adheres each of the first and second substrates 101 and 102 in the r1 and c1, r1 and c3, and r1 and c5 positions. Here, the pressure member 130 has a lattice structure so as to compress or pressurize the substrates adjacent to or surrounding the substrate or substrates irradiated with the laser. At this time, the sizes of the openings in the lattice structure are larger than each substrate so that the pressure member 130 compresses the substrates surrounding the substrate irradiated with the laser. In other words, while the first and second substrates 101 and 102 in the r1 and c1 position are adhered, the first and second substrates 101 and 102, in r1 and c2, r2 and c1, and r2 and c2 positions and surrounding the first and second substrates 101 and 102 in the r1 and c1 position, are pressurized by the pressure member 130 with a force F. At the same time, while the first and second substrates 101 and 102 in the r1 and c3 position are adhered, the first and second substrates 101 and 102, in r1 and c2, r1 and c4, r2 and c2, r2 and c3, and r2 and c4 positions and surrounding the first and second substrates 101 and 102 in the r1 and c3 position, are pressurized by the pressure member 130. Simultaneously, while the first and second substrates 101 and 102 in the r1 and c5 position are adhered, the first and second substrates 101 and 102, in r1 and c4, r1 and c6, r2 and c4, r2 and c5, and r2 and c6 positions and surrounding the first and second substrates 101 and 102 in the r1 and c5 position, are pressurized by the pressure member 130.

In this manner, after the laser irradiation member 120 simultaneously adheres the first and second substrates 101 and 102 in the r1 and c1, r1 and c3, and r1 and c5 positions, the laser irradiation member 120 and the pressure member 130 move in the X-direction by one cell. As illustrated in FIG. 4B, the laser irradiation member 120 moves in the X-axis direction, and simultaneously adheres the first and second substrates 101 and 102 arranged in r1 and c2, r1 and c4, and r1 and c6 positions. The pressure member 130 moves together with the laser irradiation member 120, and sequentially pressurizes substrates surrounding each substrate irradiated with the laser.

Also, although it is not illustrated in the above drawings, after adhesion of the first and second substrates 101 and 102 arranged in the r1 row is completed, the laser irradiation member 120 moves to the r2 row and sequentially adheres the first and second substrates 101 and 102 arranged in the r2 row by using the aforementioned method.

The method of manufacturing the organic light emitting display device by using the frit sealing system according to the first embodiment compresses or pressurizes a substrate using the pressure member 130, thereby improving adhesion of a frit is improved and increasing long-term reliability of a.

Second Embodiment

Figure 5:
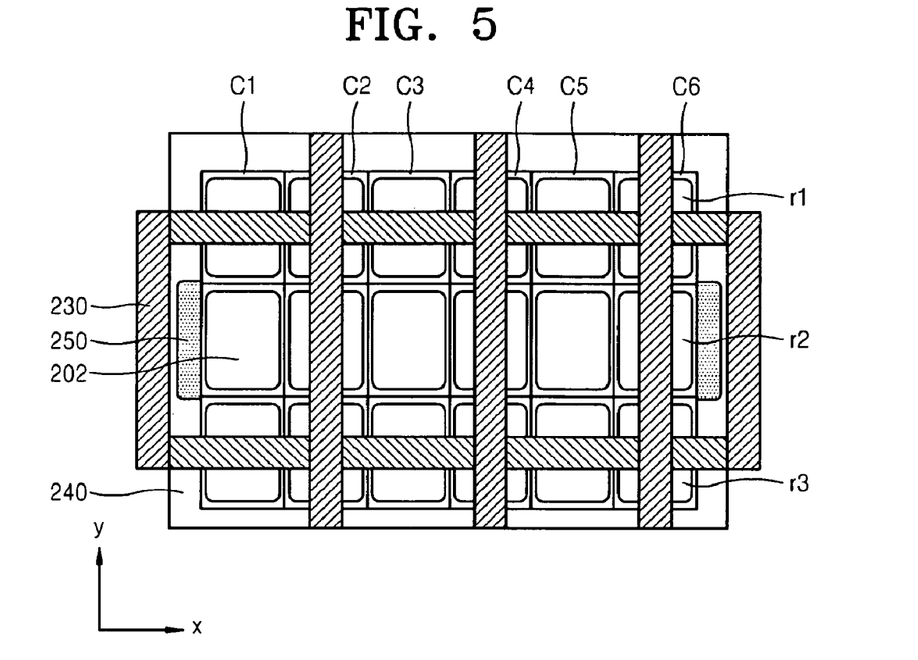
FIG. 5 is a plan view of a frit sealing system according to a second embodiment.
Figure 6:
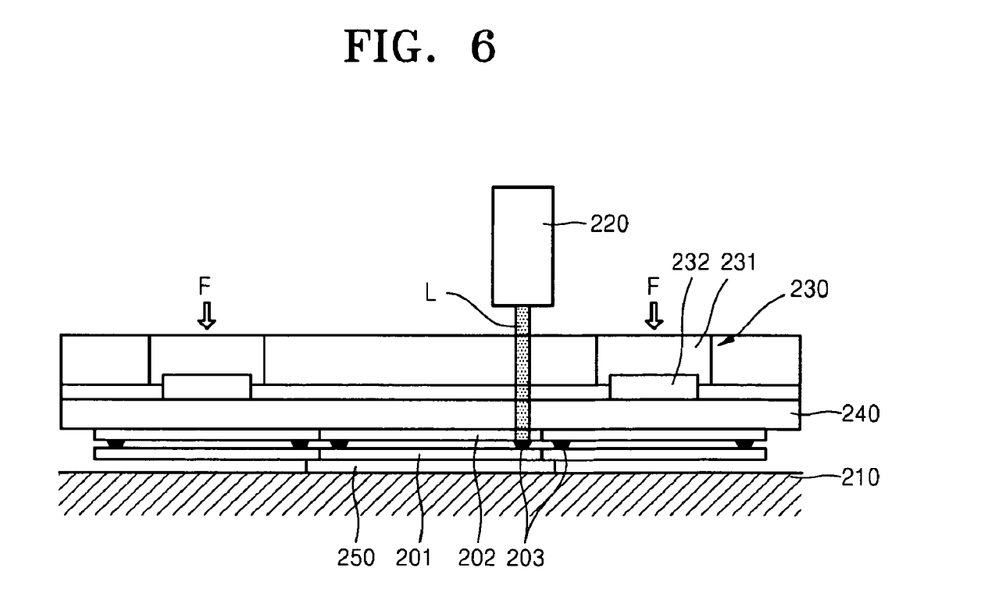
FIG. 6 is a cross-sectional side view of the frit sealing system of FIG. 5.
Figure 7:
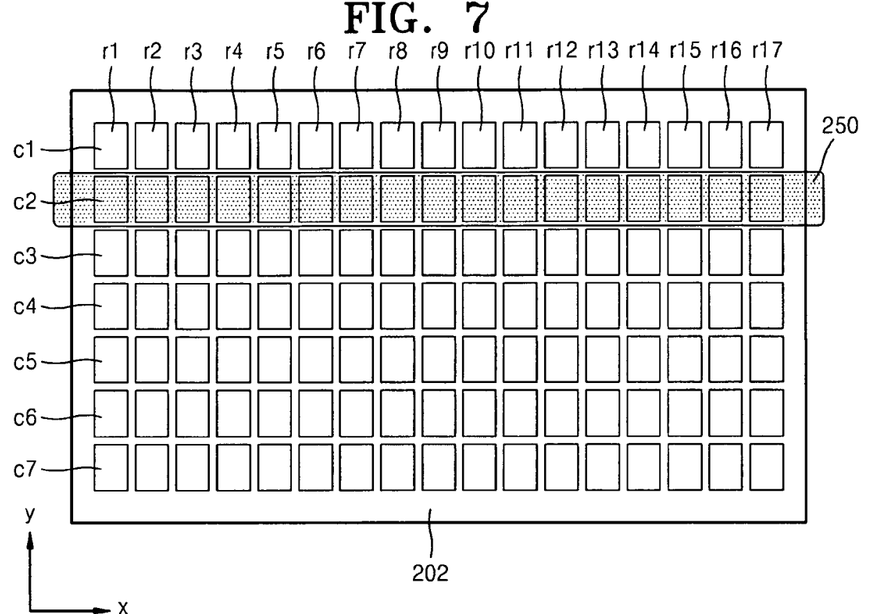
FIG. 7 is a plan view illustrating a relationship between first and second substrates and a partial pressure member in the frit sealing system of FIG. 5.

FIG. 5 is a plan view of a frit sealing system according to a second embodiment. FIG. 6 is a cross-sectional side view of the frit sealing system of FIG. 5. FIG. 7 is a plan view illustrating a relationship between first substrates 201 and second substrates 202, and a partial pressure member 250 in the frit sealing system of FIG. 5.

Referring to FIGS. 5 and 6, the frit sealing system according to the second embodiment includes a bed member 210, a laser irradiation member 220, a pressure member 230, a mask 240, and a partial pressure member 250.

The first substrates 201 and the second substrates 202 are placed on the bed member 210. A frit 203 is coated or disposed between the first substrates 201 and the second substrates 202.

The laser irradiation member 220 irradiates the frit 203 between the first substrate 201 and the second substrate 202 with a laser beam, thereby melting-adhering the frit 203 to the first and second substrates 201 and 202.

The pressure member 230 is disposed on an upper part of the first and second substrates 201 and 202 that are irradiated with the laser and adhered together, thereby pressurizing or compressing an outer side of the first and second substrates 201 and 202.

The mask 240 is placed on a top surface of the second substrate 202, and prevents the pressure member 230 from directly contacting the second substrate 202, thereby protecting the second substrate 202 against breakage and damage.

The partial pressure member 250 is disposed between the bed member 210 and the first substrate 201 so that a force, by which the pressure member 230 pressurizes the first and second substrates 201 and 202, is concentrated on an area over which the partial pressure member 250 is disposed.

Referring to FIG. 7, the partial pressure member 250 is disposed lengthwise in a first direction (for example, an X-direction of FIG. 7) between the bed member 210 (See FIG. 6) and the first substrate 201 (See FIG. 6). An X-direction length of the partial pressure member 250 is approximately equal to an overall X-direction length of the first and second substrates 201 and 202. Also, a Y-direction length of the partial pressure member 250 is approximately equal or larger than a length of one cell.

Due to such a partial pressure member 250, when the first and second substrates 201 and 202 are compressed or pressurized by the pressure member 230 (See FIG. 6), an area over which the force is applied may be reduced. Thus, the force of the pressure member 230 may be concentrated on an area irradiated by the laser without being dispersed over the entire area of the first and second substrates 201 and 202, so that a seal quality may be much improved.

Figure 8:
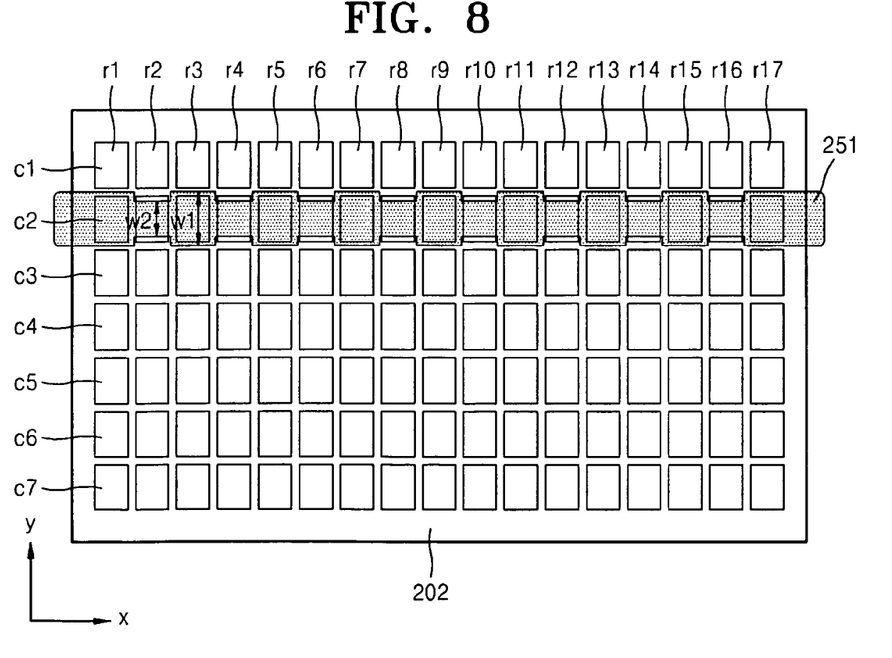
FIG. 8 is a plan view of a frit sealing system illustrating a relationship between the first and second substrates and a partial pressure member, according to a first modified embodiment of the second embodiment.

FIG. 8 is a plan view of a frit sealing system that illustrates a relationship between the first and second substrates 201 (See FIG. 6) and 202 and a partial pressure member 251 according to a first modified embodiment of the second embodiment.

For convenience of explanation, the difference between the first modified embodiment of the second embodiment and the second embodiment will be described.

Referring to FIG. 8, in the frit sealing system according to the first modified embodiment of the second embodiment, a width of a first part of a partial pressure member 251 is wider than a width of second part of the partial pressure member 251.

To be more specific, a width w1 of a portion of the partial pressure member 251 under an area irradiated with by the laser is wider than a width w2 of portions of the partial pressure member 251 under areas adjacent to either side of the irradiated area or unit display. That is, according to such a structure, an area receiving a force from the pressure member 230 (See FIG. 6) is much reduced compared with the second embodiment illustrated in FIG. 7. Thus, the force of the pressure member 230 may be concentrated on the area irradiated with the laser without being dispersed over a larger area of the first and second substrates 201 and 202, so that a sealing quality may be much improved.

At this time, the partial pressure member 251 and the laser irradiation member 220 move together in such a manner that the width w1 of the partial pressure member 251 in the area irradiated by the laser may be kept wider than the width w2 of the partial pressure member 251 on either side of the area irradiated by the laser.

Figure 9A:
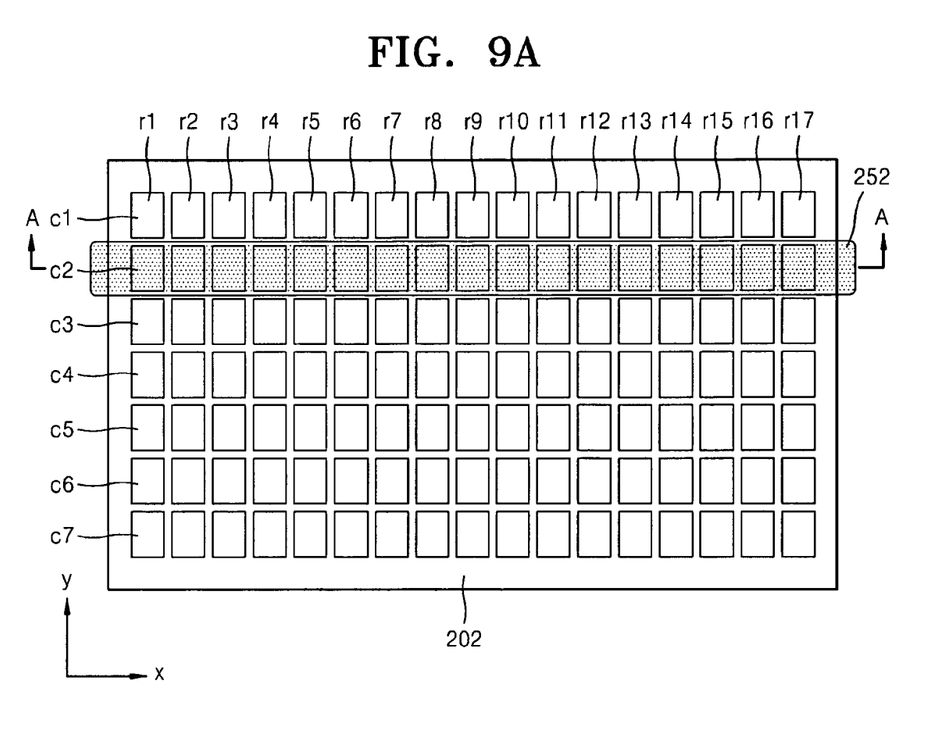
FIG. 9A is a plan view of a frit sealing system illustrating a relationship between the first and second substrates and a partial pressure member, according to a second modified embodiment of the second embodiment.
Figure 9B:
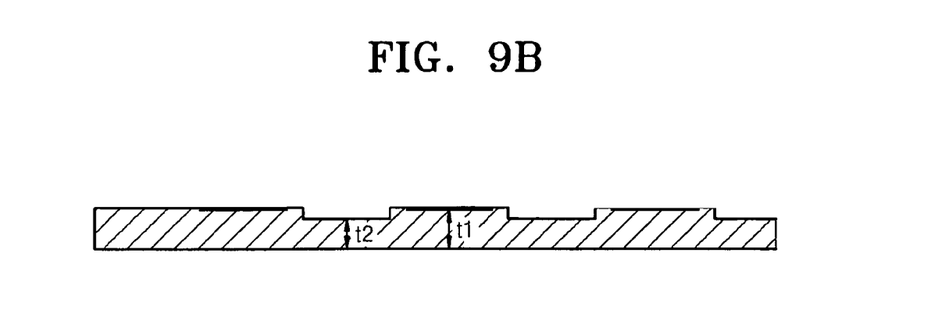
FIG. 9B is a cross-sectional view of the frit sealing system of FIG. 9A, taken along line A-A.

FIG. 9A is a plan view of a frit sealing system to illustrate a relationship between the first and second substrates 201 (See FIG. 6) and 202 and a partial pressure member 252, according to a second modified embodiment of the second embodiment. FIG. 9B is a cross-sectional view of the frit sealing system of FIG. 9A, taken along line A-A'.

Referring to FIGS. 9A and 9B, in the frit sealing system according to the second modified embodiment of the second embodiment, a thickness of a first part of the partial pressure member 252 is thicker than a thickness of second part of the partial pressure member 252.

To be more specific, a thickness t1 of the partial pressure member 252 under an area irradiated with a laser is thicker than a thickness t2 of the partial pressure member 252 on either side or adjacent to the area or unit display irradiated by the laser. That is, compared to the second embodiment illustrated in FIG. 7, according to such a structure, a force applied to an area contacting the pressure member 230 (See FIG. 6) is much increased, and the force of the pressure member 230 is concentrated on the area irradiated by the laser without being dispersed over a larger area of the first and second substrates 201 and 202, so that a sealing quality may be much improved.

At this time, the partial pressure member 252 and the laser irradiation member 220 (See FIG. 6) move together in such a manner that the partial pressure member 252 under the area irradiated by the laser is thicker (t1) than partial pressure member 252 under either side of the area irradiated by the laser (t2).

Figure 10:
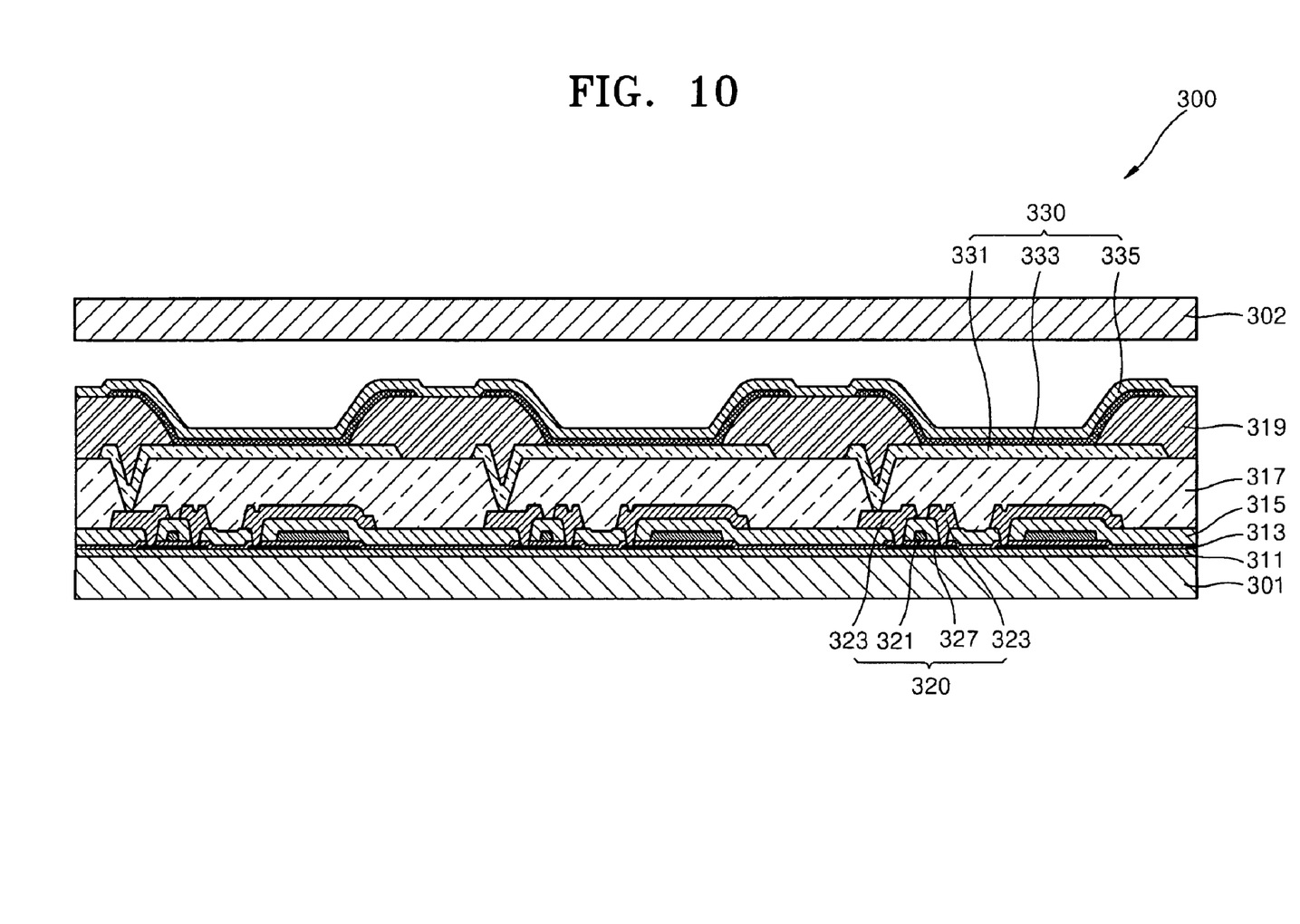
FIG. 10 is a cross-sectional view of a part of an embodiment of an organic light emitting display device.

FIG. 10 is a cross-sectional view of a part of an organic light emitting display device, and in particular, a detail of a structure of a display unit 300.

Referring to FIG. 10, a plurality of thin film transistors (TFTs) 320 are arranged on a substrate 301, and a plurality of organic light emitting devices (OLEDs) 330 are respectively arranged on the plurality of TFTs 320. Each OLED 330 includes a pixel electrode 331 electrically connected to each TFT 320, a counter electrode 335 disposed so as to completely cover a surface of the substrate 301, and an intermediate layer 333, which is disposed between the pixel electrode 331 and the counter electrode 335 and which includes at least an emissive layer.

The TFTs 320, each including a gate electrode 321, source and drain electrodes 323, a semiconductor layer 327, a gate insulating layer 313, and an intermediate insulating layer 315, are arranged on the substrate 301. However, a structure of each TFT 320 is not limited to a structure illustrated in FIG.

10. Various TFTs, such as an organic TFT comprising a semiconductor layer 327 comprising an organic material, a silicon TFT comprising silicon, and the like may be used as the TFT 320. If desired, a buffer layer 311, comprising silicon oxide and/or silicon nitride, may be further arranged or disposed between the TFTs 320 and the substrate 301.

The intermediate layer 333 includes the at least emissive layer, and may include a plurality of layers as described below.

The pixel electrode 331 serves as an anode electrode, and the counter electrode 335 serves as a cathode electrode. However, the polarity of the pixel electrode 331 and the counter electrode 335 may be switched.

The pixel electrode 331 may comprise a transparent electrode or a reflective electrode. When the pixel electrode 331 comprises a transparent electrode, the pixel electrode 331 may comprise ITO, IZO, ZnO, and/or $In_2O_3$. When the pixel electrode 331 comprises a reflective electrode, the pixel electrode 331 may comprise a reflective film comprising Ag, Mg, Al, Pt, Pd, Au, Ni, Nd, Ir, Cr, and/or compounds, alloys, and/or mixtures thereof, and a film comprising ITO, IZO, ZnO, and/or $In_2O_3$ disposed on the reflective film.

The counter electrode 335 may also comprise a transparent electrode or a reflective electrode. When the counter electrode 335 comprises transparent electrode, the counter electrode 335 may include a deposited film, and an auxiliary electrode or a bus electrode line formed on the deposited film. The deposited film comprises Li, Ca, LiF/Ca, LiF/Al, Al, Mg, and/or their compounds, which are deposited facing the intermediate layer 333 between the pixel electrode 331 and the counter electrode 335. The auxiliary electrode or the bus electrode line comprises one or more transparent electrode materials, such as ITO, IZO, ZnO, and/or $In_2O_3$. The counter electrode 335 may comprise a reflective electrode comprising Li, Ca, LiF/Ca, LiF/Al, Al, Mg, and/or their compounds.

Meanwhile, a pixel defining layer (PDL) 319 is arranged with a predetermined thickness on an outer part of the pixel electrode 331, thereby, covering an edge of the pixel electrode 331. The PDL 319 defines an emissive area, and enlarges a gap between the edge of the pixel electrode 331 and the counter electrode 335 so as to prevent an electric field from being concentrated on the edge of the pixel electrode 331, thereby serving to prevent a short circuit between the pixel electrode 331 and the counter electrode 335.

The intermediate layer 333, having a plurality of layers including at least an emissive layer, is arranged between the pixel electrode 331 and the counter electrode 335. The intermediate layer 333 may comprise one or more low molecular weight organic materials and/or polymer organic materials.

In some embodiments comprising the low molecular weight organic materials, the intermediate layer 333 may comprise a hole injection layer (HIL), a hole transport layer (HTL), an emissive layer (EML), an electron transport layer (ETL), an electron injection layer (EIL), or the like, which are laminated into a single or a complex structure. The intermediate layer 333 may comprise various organic materials such as a copper phthalocyanine (CuPc), an N,N'-di(naphthalene-1-yl)-N, N'-diphenyl-benzidine (NPB), a tris-8-hydroxyquinoline aluminum ($Alq_3$), and the like. The low molecular weight organic materials may be formed by a vacuum deposition method using masks.

In some embodiments comprising polymer organic materials, in general, the intermediate layer 333 may have a structure formed of an HTL and an EML. At this time, the HTL comprises PEDOT, and the EML comprises poly-phenylenevinylene(PPV)-based and polyfluorene-based polymer organic materials.

Each OLED 330 is electrically connected to a respective TFT 320 at a lower position, and at this time, if a planarization layer 317 covers the TFTs 320, the OLEDs 330 are disposed on the planarization layer 317. The pixel electrode 331 of each OLED 330 is electrically connected to each TFT 320 via a contact hole in the planarization layer 317.

Meanwhile, the OLEDs 330 formed on the substrate 301 are sealed with an encapsulation substrate 302. As described above, the encapsulation substrate 302 may comprise various materials such as glass, plastic material, or the like.

According to the frit sealing system and the method of manufacturing the organic light emitting display device by using the frit sealing system, adhesion of the frit can be improved and a long-term reliability of a cell can be increased.

While certain embodiments have been particularly shown and described with reference to exemplary embodiments above, it will be understood by one of ordinary skill in the art that various changes in form and details may be made therein without departing from the spirit and scope of the disclosure as defined by the appended claims. The exemplary embodiments should be considered in a descriptive sense only and not for purposes of limitation. Therefore, the scope of the disclosure is defined not by the detailed description above, but by the appended claims, and all differences within the scope will be construed as being included therein.

What is claimed is:

1. A frit sealing system configured for adhering a first mother substrate to a second mother substrate with a frit, wherein the first mother substrate comprises a plurality of first substrates and the second mother substrate comprises a plurality of second substrates, the frit sealing system comprising:
    a bed member configured to support a first mother substrate and a second mother substrate disposed thereon;
    a laser irradiation member configured for irradiating a frit disposed between the first mother substrate and the second mother substrate with a laser beam; and
    a pressure member configured to be disposed on an upper surface of the second mother substrate, and configured for compressing the frit between the first mother substrate and the second mother substrate, thereby improving adhesion therebetween.

2. The frit sealing system of claim 1, wherein the frit sealing system is configured to simultaneously and/or sequentially adhere the first substrates and the second substrates arranged in one or more rows and columns.

3. The frit sealing system of claim 2, wherein the pressure member comprises a lattice structure, configured for compressing the first substrates and second substrates surrounding the first substrate and second substrate irradiated by the laser irradiation member.

4. The frit sealing system of claim 3, wherein a lattice opening of the lattice structure is larger than one of the first and second substrates, and configured to pressurize the first substrates and second substrates surrounding the first and second substrates irradiated by the laser irradiation member.

5. The frit sealing system of claim 2,
    wherein the laser irradiation member is configured to sequentially adhere the first substrates and the second substrates arranged in a first direction, and
    wherein the pressure member is configured to move in concert with the laser irradiation member and is configured to sequentially pressurize the first substrates and second substrates surrounding the first substrate and second substrate irradiated by the laser irradiation member.

6. The frit sealing system of claim 1, further comprising a mask configured to be disposed between the top surface of the second substrate and the pressure member, thereby transmitting pressure from the pressure member to the second substrate.

7. The frit sealing system of claim 1,
wherein the first substrate comprises a pixel region comprising at least one OLED (organic light emitting device) having a first electrode, an organic layer, and a second electrode, and a non-pixel region disposed outside the pixel region,
wherein the second substrate is disposed over the pixel region of the first substrate, and
wherein the frit is disposed between the first substrate and the second substrate in the non-pixel region.

8. The frit sealing system of claim 1, wherein at least a portion of the pressure member configured for contacting the second substrate comprises an elastic material.

9. The frit sealing system of claim 2, further comprising a partial pressure member configured to be interposed between the bed member and the first substrate, and configured to concentrate a compressive force on the first substrates and the second substrates adjacent to the first substrate and the second substrate irradiated by the laser irradiation member.

10. A frit sealing system configured for adhering a first mother substrate and a second mother substrate with a frit, wherein the first mother substrate comprises a plurality of first substrates and the second mother substrate comprises a plurality of second substrates, the frit sealing system comprising:
a bed member configured to support a first mother substrate and a second mother substrate disposed thereover;
a laser irradiation member configured for irradiating with a laser beam a frit disposed between the first mother substrate and the second mother substrate;
a pressure member configured for compressing the frit between the first mother substrate and the second mother substrate; and
a partial pressure member disposed on the bed member, configured to be interposed between the bed member and the first substrate.

11. The frit sealing system of claim 10,
wherein the laser irradiation member is configured to sequentially adhere a plurality of first substrates and second substrates disposed in a first direction, and
wherein the partial pressure member is parallel to the first direction.

12. The frit sealing system of claim 11, wherein the partial pressure member comprises a wider portion and a narrower portion.

13. The frit sealing system of claim 12, wherein the narrower portion of the partial pressure member corresponds to the first substrate and second substrate irradiated with the laser, and the wider portion of the partial pressure member is adjacent to thereto in the first direction.

14. The frit sealing system of claim 11, wherein the partial pressure member comprises thicker portion and a thinner portion.

15. The frit sealing system of claim 14, wherein the thicker portion of the partial pressure member, corresponds to the first substrate and second substrates irradiated with the laser, and the thinner portion is adjacent thereto in the first direction.

16. The frit sealing system of claim 11, wherein the partial pressure member is configured to move sequentially under each first substrate and second substrate irradiated by the laser irradiation member.

* * * * *